(12) United States Patent
Evans et al.

(10) Patent No.: US 6,476,745 B1
(45) Date of Patent: Nov. 5, 2002

(54) VOICE CODEC AUTOMATIC GAIN CONTROL

(75) Inventors: Brian L. Evans, Allen, TX (US); Louis Dominic Oliveira, San Diego, CA (US); Wade L. Heimbigner, Poway, CA (US)

(73) Assignees: Texas Instruments Incorporated, Dallas, TX (US); Qualcomm Incorporated, San Diego, CA (US)

( * ) Notice: Subject to any disclaimer, the term of this patent is extended or adjusted under 35 U.S.C. 154(b) by 0 days.

(21) Appl. No.: 09/447,507

(22) Filed: Nov. 23, 1999

Related U.S. Application Data
(60) Provisional application No. 60/109,793, filed on Nov. 25, 1998.

(51) Int. Cl.[7] ................................................ H03M 1/18
(52) U.S. Cl. ...................................... 341/139; 341/155
(58) Field of Search ................................. 341/139, 155

(56) References Cited

U.S. PATENT DOCUMENTS

| | | | | |
|---|---|---|---|---|
| 5,006,851 A | * | 4/1991 | Kaneaki et al. ............. | 341/155 |
| 5,239,586 A | * | 8/1993 | Marui ......................... | 381/107 |
| 5,534,862 A | | 7/1996 | Gross, Jr. et al. ........... | 341/144 |
| 5,630,221 A | * | 5/1997 | Birleson ..................... | 341/139 |
| 5,677,962 A | * | 10/1997 | Harrison .................... | 381/109 |
| 5,821,889 A | * | 10/1998 | Miller ......................... | 341/139 |
| 5,886,656 A | * | 3/1999 | Feste et al. ................. | 341/143 |
| 6,215,429 B1 | * | 4/2001 | Fischer et al. .............. | 341/139 |
| 6,233,554 B1 | | 5/2001 | Oliveira et al. | |

OTHER PUBLICATIONS

Riedmuller et al., A Low Power 13–bit Linear Feature Codec with Programmable Frontend, 5th IEEE International Symposium on Wireless Networks, 1994, Sep. 18–23, 1994, vol. 2 pp. 467–471.*

Bakkaloglu et al., A Voice–Band Audio Processor IC for CDMA applications, 1998 IEEE Proceedings of Midwest Symposium on Circuits and Systems, Aug. 9–12, 1998, pp. 484–487.*

* cited by examiner

Primary Examiner—Howard L. Williams
(74) Attorney, Agent, or Firm—Ronald O. Neerings; Wade James Brady III; Frederick J. Telecky, Jr.

(57) ABSTRACT

An Automatic Gain Control System for voice codecs used in a digital wireless handset or in any other environment where there is a large amount of background noise. The invention utilizes the processing power available in Digital Signal Processor 111 to adaptively adjust the gain of amplifier 202 and filter 205 in the transmit channel to eliminate audio distortion in a "loud talker" environment. The gain correction information is transmitted by the DSP 111 to the digital filter and PCM I/O block 204 in the 3 unused bits of the 16 bit PCM data word thus eliminating any additional connections.

10 Claims, 4 Drawing Sheets

VOICE CODEC AUTOMATIC GAIN CONTROL

This application claims priority under 35 U.S.C. §119(e)(1) of provisional application No. 60/109,793, filed Nov. 25, 1998.

TECHNICAL FIELD OF INVENTION

The technical field of this invention is communication systems, particularly communication systems as applied in digital wireless telephone handsets.

BACKGROUND OF INVENTION

In a digital telephone handset, the speaker's voice is converted to an electric current in a microphone. This current is then amplified in an analog preamplifier, and converted to a digital representation using an analog to digital converter. The output of the analog to digital converter is a pulse code modulated signal that in a wireless telephone application will typically have a dynamic range of 13 bits. This digital signal is then passed through a digital filter to remove aliasing that may be generated in the analog to digital converter, and is then passed on to a Digital Signal Processor for further processing. In order to compensate for the manufacturing tolerances of the various components in this chain, the gain of the analog preamplifier and the digital filter is programmable. During the manufacturing process, the gains of the various amplifiers are adjusted to balance the overall gain of the system to the design requirement, usually by adjusting a PGA (Programmable Gate Array). Once this adjustment is made, the gains become fixed, and can no longer be changed.

When the phone is used in a location with a high background noise, a situation is encountered known as the "loud talker environment". The combination of the high background noise and the louder than normal speech of the user will generate an abnormally large signal from the microphone and preamplifier. This may then exceed the dynamic range capability of the analog to digital converter and the digital filter, resulting in clipping and distortion. In an extreme case, this clipping may result in the PCM signal becoming fully saturated, in which case all of the intelligence content of the signal is lost. In a less serious case, the clipping will result in a distortion of the voice signal. The Digital Signal Processor may attempt to correct the distortion, but it is usually not possible to do that in a satisfactory manner since the damage is done by the time the DSP receives the signal. In the digital phones available today, this is a major problem that seriously limits the usefulness of the phone in a noisy environment.

SUMMARY OF THE INVENTION

The present invention provides an active Automatic Gain Control (AGC) system that uses the processing power available in the Digital Signal Processor to detect the distortion caused by the clipping in the ADC and the digital filter, and then adjusts the variable gain components to maintain the signal level below the clipping threshold. While the current invention shows this applied in a digital wireless telephone, the same problem exists in voice codecs in general, and the solution applies wherever voice is digitized in a high background noise environment.

While Automatic Gain Control circuits are know in the art and are commonly used in analog communication systems, they are difficult to implement in a digital system. The present invention makes the implementation practical by using the processing power available in the Digital Signal Processor to recognize the distortion, and to apply the required correction.

BRIEF DESCRIPTION OF THE DRAWINGS

These and other aspects of this invention are illustrated in the drawings, in which.

DESCRIPTION OF THE PREFERRED EMBODIMENT

The present invention includes an active Automatic Gain Control circuit that allows digital wireless telephone systems to operate in a high background noise environment by detecting the audio distortion caused by the noise, and takes corrective action by adjusting the system gain to reduce or eliminate the distortion.

Figure 1:
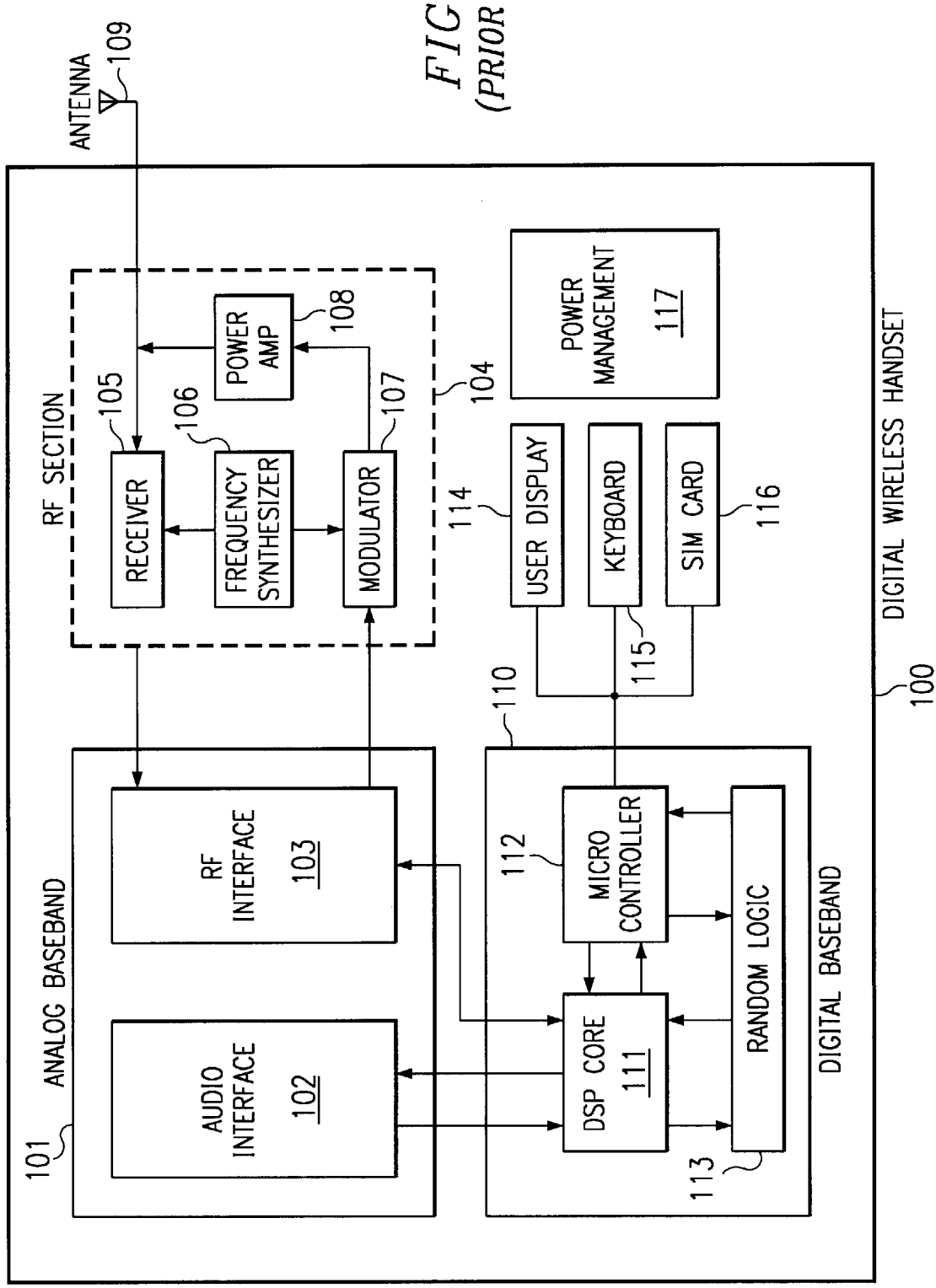
FIG. 1 shows the block diagram of one possible embodiment of a digital wireless handset

FIG. 1 shows a typical embodiment of a digital wireless handset 100 in a block diagram format. The analog baseband function (ABB) 101 contains the transmit and receive channels shown in FIG. 2, and the radio frequency (RF) interface circuits. This function may be implemented using an integrated circuit such as the TCM-4400. The input to ABB 101 is from microphone 201, and audio is output to earphone 212. The RF interface connects to the RF section 104, typically comprising of a receiver 105 such as a TRF-1500, frequency synthesizer 106 such as a TRF20xx and a modulator 107 such as a TRF-3xxx. The designation "xx" shows the availability of multiple parts that are implementation dependent. The power amplifier 108 is typically constructed from discreet components well known in the art. The output of the power amplifier 108 and the input of receiver 105 connect to the antenna 109. The integrated circuits TCM-4400, TRF-1500, TRF20xx and TRF-3xxx are available from Texas Instruments, Inc.

The digital baseband unit 110 may be a single integrated circuit, such as a GEMI12LA68, and will typically contain the DSP 111 used in audio and other signal processing functions, the micro controller 112 used for control and user interface functions, and random logic 113 for miscellaneous functions. User display 114, keyboard 115 and sim card interface 116 are implementation dependent and are normally constructed from discreet components. The functions of the keyboard and display are self explanatory. The sim card contains subscriber and security information specific to the service being used. Functional block 105 contains power supply, control and management circuits, and may be implemented with an integrated circuit such as the TPS-9120. Circuits GEMI12LA68 and TPS-9120 are also available from Texas Instruments, Inc.

Figure 2:
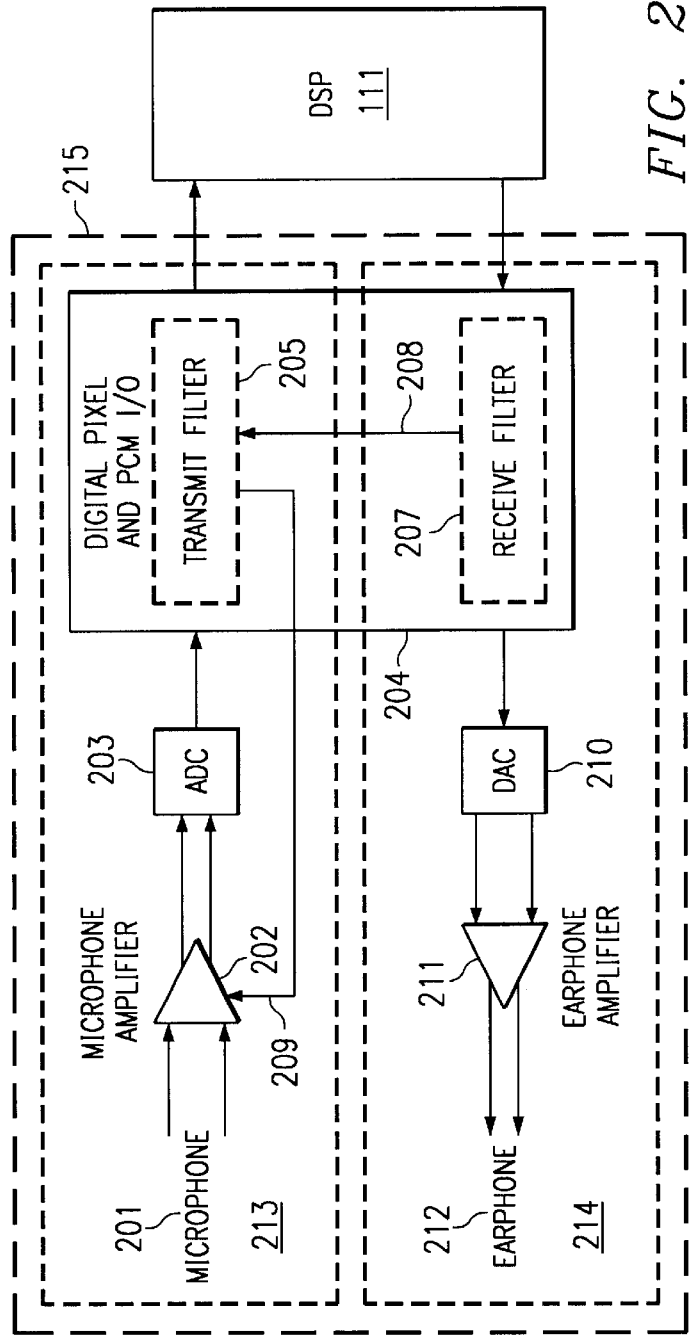
FIG. 2 is a block diagram of one embodiment of the invention, showing the audio components of a digital wireless handset.

FIG. 2 illustrates in a block diagram form the preferred embodiment of the invention. This figure shows the audio portion of a digital wireless handset. The handset is responsive to input from microphone 201, and generates the audio output in earphone 212. The signal output of microphone 201 is amplified in variable gain amplifier 202. The gain of amplifier 202 can be reduced by 6 db, using control line 209. The output of amplifier 202 is then converted to digital representation by analog to digital converter (ADC) 203. The output of ADC 203 is then filtered and further amplified by transmit filter 205, implemented within the digital filter and PCM I/O block 204. Filter 205 is a variable gain device, and it's gain may be reduced by 6 db in 2 db steps, under the control of the digital signal processor (DSP) 111. If more than 6 db gain reduction is required, the filter block 205 activates control line 209 thus reducing the gain of amplifier 202 by 6 db. Functional blocks 201, 202, 203 and 205 comprise the transmit channel 213 of the digital handset.

Figure 6:
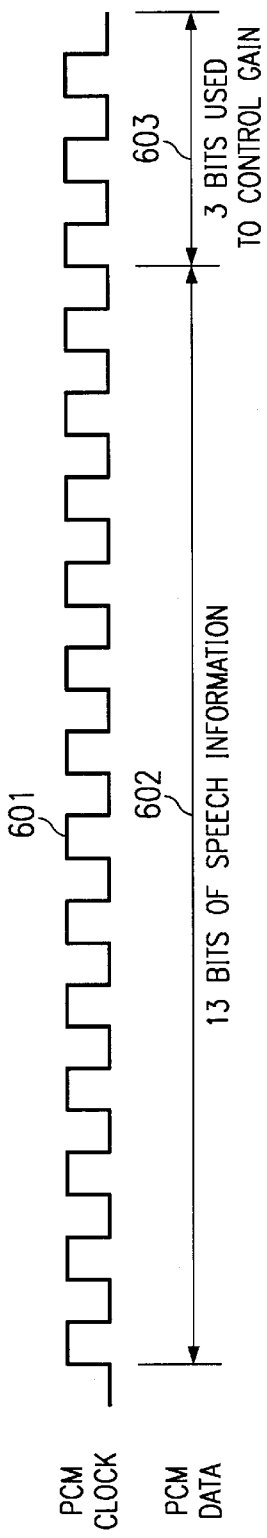
FIG. 6 shows the PCM data format from the DSP to PCM I/O block 204 in FIG. 2, showing the control information format.

The audio to be output is supplied to receive filter 207 by the DSP 206. This audio is in the pulse code modulated (PCM) format shown in FIG. 6. The transfer is controlled by PCM CLOCK 601, and is formatted in 16 bit words. In each 16 bit word, the audio information is contained in 13 bit segment 602. The remaining 3 bit segment 603 contains the gain control information from the DSP to the transmit channel. This information is extracted by receive filter 207, and is communicated to transmit filter 205 through control line 208.

Figure 7:
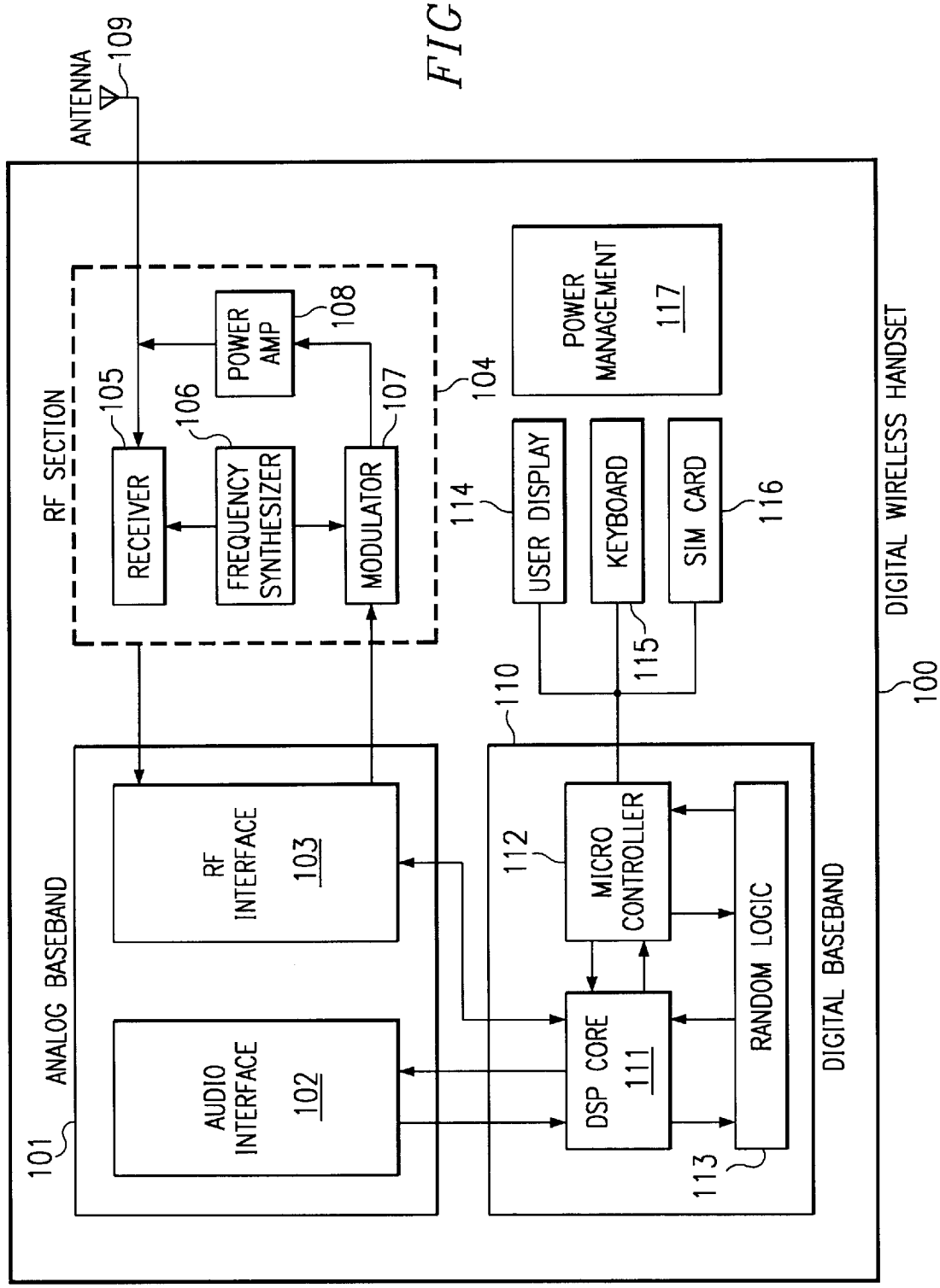

The output of receive filter 207 is converted to analog format by digital to analog converter (DAC) 210, amplified by earphone amplifier 211 and then converted to sound by earphone 212. Functional blocks 207, 210, 211 and 212 comprise the receive channel 214 of the digital handset. FIG. 7 illustrates a digital wireless handset 100 that implements audio interface 215, according to a preferred embodiment of the invention.

Figure 3:
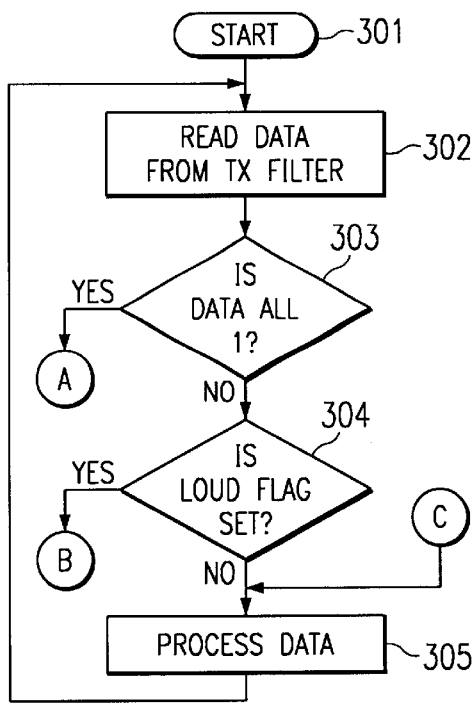
FIG. 3 is a flow chart of the actions the DSP takes during normal operation.

FIG. 3 shows the normal program flow in DSP 111. Start block 301 initializes the system, and then block 302 reads one data sample in a 16 bit PCM format data word from transmit filter 205. Test block 303 determines if the 13 significant data bits are all 1's, indicating a clipping condition. If the result of the comparison is no, test block 304 checks if the loud flag is set. If not, block 305 completes processing of the audio data, and then returns control to block 302 to process the next data sample.

Figure 4:
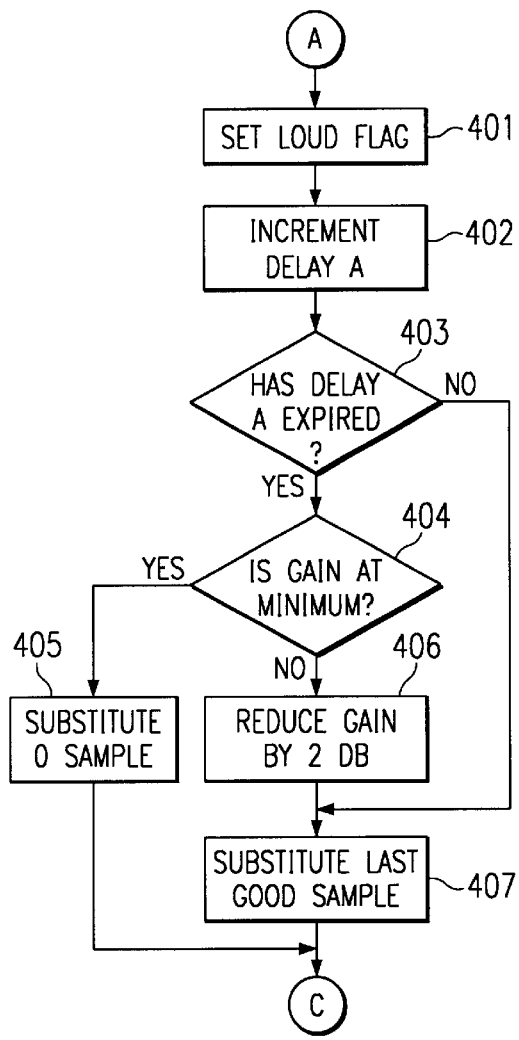
FIG. 4 is a flow chart of the actions when the "loud talker" condition is detected.

If the comparison in test block 303 detects a data word of all 1's indicating a clipping condition, program flow transfers to block 401 in FIG. 4. First, the loud flag is set in block 401, then delay counter A is incremented in block 402. The purpose of the delay counter is to ignore clipping caused by short transient noise spikes. The value of the delay is implementation dependent, but would typically be in the millisecond range. Test block 403 then determines if the preset delay value has been reached. If not, block 407 replaces the clipped audio sample with the last good sample value, and returns control to block 305.

If test block 403 detects that the delay value has expired, the current gain setting is checked by test block 404. This is done by reading the gain control register in memory. This register is initialized by start block 301 to a value of 12, representing the initial gain of the transmit channel. Every time the DSP 111 makes a gain adjustment, this register is updated with the new value. Since the maximum gain reduction is 12 db, a value of 0 in this register indicates that the minimum gain has been reached. Conversely, a value of 12 indicates that initial gain setting has been restored. If the gain is already at the minimum possible value, block 405 substitutes a 0 data word thus effectively muting the audio, and returns control to block 305. If the gain is not at minimum, block 406 reduces the gain by 2 db, and transfers control to 407 which then replaces the clipped value with the last good sample and than returns control to 305.

Figure 5:
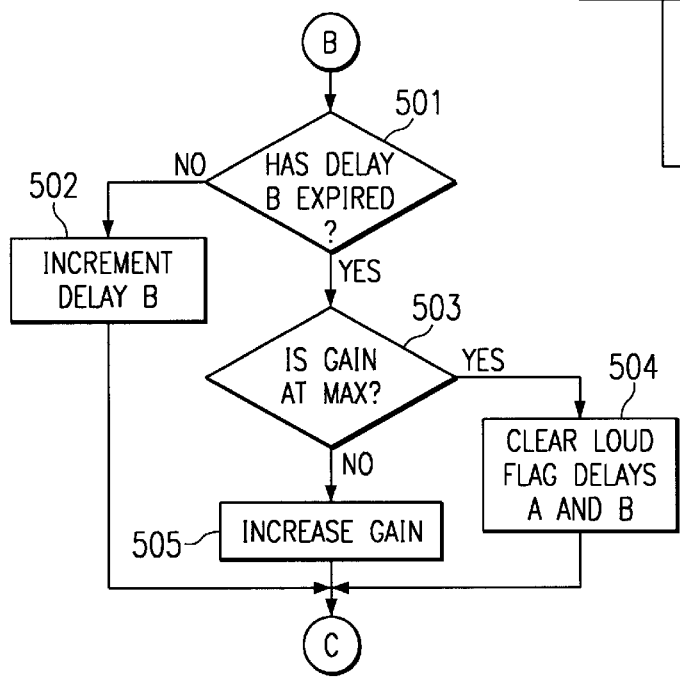
FIG. 5 is a flow chart of the actions taken at the end of the "loud talker" condition.

If test block 304 determines that the loud flag is set, control transfers to block 501 in FIG. 5. At this point, we check in 501 if delay time B has expired. The purpose of the delay is to ignore short transients that may be meaningless. The length of this delay is also implementation dependent, but would typically be in the millisecond range. If the delay has not expired, the delay counter B is incremented in block 502, and control is returned to 305 to complete processing the data. If the delay B has expired, test block 503 checks if the gain is already at the maximum value. If yes, block 504 clears the loud flag, resets delays A and B, and returns control to block 305. If the gain is not at maximum, block 505 increases gain by 2 db, and then returns control to 305.

What is claimed is:

1. An Automatic Gain Control System, comprising:

a variable gain microphone amplifier;

an analog-to-digital converter coupled to said microphone amplifier;

a variable gain anti aliasing filter coupled to said analog to digital converter; and a processing element, coupled to said filter, programmed to detect saturation of digital output from the anti aliasing filter, and further programmed to adjust the gain of the microphone amplifier and of the anti aliasing filter to eliminate said saturated output, gain correction information is transmitted from the processing element to the variable gain microphone amplifier and the anti aliasing filter by employing the unused 3 bits of the 16-bit PCM (Pulse Code Modulation) data word used to communicate between the processing element and the filter, thus eliminating any additional connections.

2. A method of reducing the audible effect of a saturated signal by replacing the said signal with the last known good sample value for a predetermined period of time, and then muting the output by substituting 0's until the gain is reduced sufficiently to eliminate saturation.

3. An automatic gain control system, comprising:

a variable gain analog signal amplifier;

an analog-to-digital converter responsive to said amplifier;

a variable gain filter responsive to said analog-to-digital converter; and a processing element, responsive to said filter, programmed to detect saturation of digital output from the filter, and further programmed to adjust the gain of the microphone amplifier and of the filter to eliminate said saturated output, gain correction information is transmitted from said processing element to said amplifier and the filter by employing 3 bits of a 16-bit data word used to communicate between said processing element and said filter.

4. A method of adjusting the gain of an amplifier and filter in a transmit channel to reduce audio distortion in a noisy environment, comprising the steps of:

reading a data sample from said filter;

determining if a selected number of data bits within a group of data bits in said data sample are all 1's;

checking to see if a flag is set indicating a loud condition if said significant data bits in said determining step are not all 1's; and processing audio data and return to the reading step when complete if a flag is not set indicating a loud condition.

5. A method of adjusting the gain of an amplifier and filter in a transmit channel to reduce audio distortion in a noisy environment, comprising the steps of:

reading a data sample from said filter;

determining if significant data bits in said data sample are all 1's;

checking to see if a flag is set indicating a loud condition if said significant data bits in said determining step are not all 1's;

processing audio data and return to the reading step when complete if a flag is not set indicating a loud condition;

setting said flag indicating a loud condition if said significant data bits in said determining step are all 1's;

increment a first delay counter;

determining if said first delay counter has reached a preset delay value;

replacing a clipped audio sample with a last good sample value and returning to said step of processing audio data if said delay counter has not reached said preset delay value; and processing audio data and returning to the reading step when complete.

6. A method of adjusting the gain of an amplifier and filter in a transmit channel to reduce audio distortion in a noisy environment, comprising the steps of:

reading a data sample from said filter;

determining if significant data bits in said data sample are all 1's;

checking to see if a flag is set indicating a loud condition if said significant data bits in said determining step are not all 1's;

processing audio data and return to the reading step when complete if a flag is not set indicating a loud condition;

setting said flag indicating a loud condition if said significant data bits in said determining step are all 1's;

increment a first delay counter;

determining if said first delay counter has reached a preset delay value;

reducing the gain if said current gain setting is at a minimum if said first delay counter has not reached a preset delay value;

replacing a clipped audio sample with a last good sample value; and returning to said step of processing audio data.

7. A method of adjusting the gain of an amplifier and filter in a transmit channel to reduce audio distortion in a noisy environment, comprising the steps of:

reading a data sample from said filter;

determining if significant data bits in said data sample are all 1's;

checking to see if a flag is set indicating a loud condition if said significant data bits in said determining step are not all 1's;

processing audio data and return to the reading step when complete if a flag is not set indicating a loud condition;

setting said flag indicating a loud condition if said significant data bits in said determining step are all 1's;

incrementing a first delay counter;

determining if said first delay counter has reached a preset delay value;

substituting a 0 data word for the gain if said delay counter has reached said preset delay counter; and returning to said step of processing audio data.

8. A method of adjusting the gain of an amplifier and filter in a transmit channel to reduce audio distortion in a noisy environment, comprising the steps of:

reading a data sample from said filter;

determining if significant data bits in said data sample are all 1's;

checking to see if a flag is set indicating a loud condition if said significant data bits in said determining step are not all 1's;

processing audio data and return to the reading step when complete if a flag is not set indicating a loud condition;

determining if a second delay counter has reached a preset delay value if said flag is set indicating a loud condition;

incrementing the count of said second delay counter if said second delay counter has not reached a preset delay value; and returning to said step of processing audio data.

9. The method of claim 8, further comprising the steps of:

checking the current gain setting after said step of determining if a second delay counter has reached a preset delay value if said flag is set indicating a loud condition;

clearing the load flag and resetting said first and second delay counters if said current gain setting is at a maximum value; and returning to said step of processing audio data.

10. The method of claim 9, further comprising the steps of:

increasing the gain if the current gain setting is at a maximum when checked at said step of checking the current gain setting; and returning to said step of processing audio data.

* * * * *